(12) United States Patent
De Gersem et al.

(10) Patent No.: US 12,381,464 B2
(45) Date of Patent: Aug. 5, 2025

(54) MAGNET ASSEMBLY, COIL ASSEMBLY, PLANAR MOTOR, POSITIONING DEVICE AND LITHOGRAPHIC APPARATUS

(71) Applicant: ASML Netherlands B.V., Veldhoven (NL)

(72) Inventors: Gudrun Ghilaine Agnes De Gersem, Veldhoven (NL); Roger Franciscus Mattheus Maria Hamelinck, Breda (NL); Jeroen Van Duivenbode, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 164 days.

(21) Appl. No.: 17/926,573

(22) PCT Filed: Apr. 18, 2021

(86) PCT No.: PCT/EP2021/060007
§ 371 (c)(1),
(2) Date: Nov. 18, 2022

(87) PCT Pub. No.: WO2021/233615
PCT Pub. Date: Nov. 25, 2021

(65) Prior Publication Data
US 2023/0208269 A1 Jun. 29, 2023

(30) Foreign Application Priority Data
May 20, 2020 (EP) .................... 20175785

(51) Int. Cl.
*H02K 41/03* (2006.01)
*G03F 7/00* (2006.01)
*H01F 6/06* (2006.01)

(52) U.S. Cl.
CPC ....... *H02K 41/031* (2013.01); *G03F 7/70758* (2013.01); *H01F 6/06* (2013.01); *H02K 2201/18* (2013.01)

(58) Field of Classification Search
CPC .. H02K 41/031; H02K 55/00; G03F 7/70758; H01F 6/06
(Continued)

(56) References Cited

U.S. PATENT DOCUMENTS

| 6,020,964 A | 2/2000 | Loopstra et al. |
| 6,144,119 A | 11/2000 | Hazelton |

(Continued)

FOREIGN PATENT DOCUMENTS

| CN | 103296862 A | 9/2013 |
| CN | 106571731 A | 4/2017 |

(Continued)

OTHER PUBLICATIONS

WO2019058735A1 English translation (Year: 2024).*
(Continued)

*Primary Examiner* — Christopher M Koehler
*Assistant Examiner* — Viswanathan Subramanian
(74) *Attorney, Agent, or Firm* — Sterne, Kessler, Goldstein & Fox P.L.L.C.

(57) ABSTRACT

The invention provides a magnet assembly for a planar electromagnetic motor, the magnet assembly comprising: —a first plurality of superconductive (SC) coils, inside an outer circumference and arranged in a planar pattern such as a rectangular pattern, —a second plurality of SC coils, arranged along an outer boundary of the planar pattern, a coil of the first plurality of SC coils having a first in-plane shape and a coil of the second plurality of SC coils having a second in-plane shape, different from the first in-plane (Continued)

shape, wherein the second plurality of SC coils is arranged at least partly inside the outer circumference.

19 Claims, 11 Drawing Sheets

(58) Field of Classification Search
USPC .......................................... 310/12.05, 12.14
See application file for complete search history.

(56) References Cited

U.S. PATENT DOCUMENTS

| | | | |
|---|---|---|---|
| 6,188,147 | B1 | 2/2001 | Hazelton et al. |
| 6,952,253 | B2 | 10/2005 | Lof et al. |
| 7,205,741 | B2 | 4/2007 | Simons et al. |
| 7,289,194 | B2 | 10/2007 | Miyajima |
| 9,634,540 | B2 | 4/2017 | Kou et al. |
| 2002/0149270 | A1 | 10/2002 | Hazelton |
| 2007/0058173 | A1 | 3/2007 | Holzapfel |
| 2014/0252888 | A1 * | 9/2014 | Kou ............... H02K 41/00 310/12.18 |
| 2014/0327327 | A1 | 11/2014 | Kou et al. |
| 2019/0009902 | A1 | 1/2019 | Chan et al. |

FOREIGN PATENT DOCUMENTS

| | | | |
|---|---|---|---|
| EP | 3 470 925 A1 | 4/2019 | |
| JP | 2000-032733 A | 1/2000 | |
| JP | 2005-327993 A | 11/2005 | |
| JP | 2006-014592 A | 1/2006 | |
| WO | WO 2019/058735 A1 | 3/2019 | |
| WO | WO-2019141450 A1 * | 7/2019 | ......... G03F 7/70358 |
| WO | WO 2019/233698 A1 | 12/2019 | |

OTHER PUBLICATIONS

International Search Report and Written Opinion of the International Searching Authority directed to related International Patent Application No. PCT/EP2021/060007, mailed Jul. 19, 2021; 11 pages.

International Preliminary Report on Patentability directed to related International Patent Application No. PCT/EP2021/060007, issued Nov. 17, 2022; 8 pages.

De Bruyn, B.J.H., "Superconducting linear motors for high-dynamic applications," Electromechanics and Power Electronics, Eindhoven University of Technology, Jan. 25, 2018; 184 pages.

Hwang et al., "A Flux-Controllable NI HTS Flux-Switching Machine for Electric Vehicle Applications," Center for Scientific Instrumentation, Applied Sciences, vol. 10, Feb. 25, 2020; pp. 1-20.

Schreiner et al., "Development of No-Insulation Racetrack Coils Wound With 2nd Generation HTS Tapes for a Stator System for Wind Generators," IEEE Transactions on Applied Superconductivity, vol. 30, No. 4, Jun. 2020; 5 pages.

Lui et al., "Experimental Characterization of a No-insolation HTS Racetrack Coil Subjected to Travelling Magnetic Fields," MT26, the International Conference on Magnet Technology, Sep. 22, 2019; 1 page.

Hahn, S., "No Protection Device: No-Insulation HTS Magnets," Applied Superconductivity Center, National High Magnetic Field Laboratory, WAMHTS-3, Sep. 11, 2015; 21 pages.

Hahn et al., "HTS Pancake Coils Without Turn-to-Turn Insulation," IEEE Transactions on Applied Superconductivity, vol. 21, No. 3, Jun. 2011; pp. 1592-1595.

Yoon et al., "26T 35mm all-$GdBa_2Cu_3O_{7-x}$ multi-width no-insulation superconducting magnet," Superconductor Science and Technology, vol. 29, No. 4, Mar. 10, 2016; pp. 1-6.

* cited by examiner

MAGNET ASSEMBLY, COIL ASSEMBLY, PLANAR MOTOR, POSITIONING DEVICE AND LITHOGRAPHIC APPARATUS

CROSS-REFERENCE TO RELATED APPLICATIONS

This application claims priority of EP application 20175785.3 which was filed on 20 May 2020, and which is incorporated herein in its entirety by reference.

FIELD

The present invention relates to a magnet assembly including a plurality of superconductive coils, a superconductive coil assembly for such a magnet assembly, a planar motor applying such a magnet assembly, a positioning device including such a planar motor and a lithographic apparatus comprising such a positioning device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In order to synchronously scan the pattern through the radiation beam and the substrate through the patterned image, the patterning device and the substrate are mounted on object tables that are positioned using positioning devices. Typically such positioning devices comprise a combination of electromagnetic actuators and motors. In a typical arrangement, such a positioning device may include a short-stroke module for accurate positioning, over comparatively small distances, of the patterning device or substrate in 6 degrees of freedom, the short stroke module including the patterning device or substrate being movable over comparatively large distances by a long stroke module, e.g. comprising one or more planar motors. The design of such a long stroke module has to meet a variety of constraints such as force requirements, constraints with respect to available footprint, constraints with respect to allowable dissipation.

SUMMARY

It is an object of the present invention to provide an improved long stroke positioning device that can be applied in a lithographic apparatus.

According to a first aspect of the invention, there is provided a magnet assembly for a planar electromagnetic motor, the magnet assembly comprising:
a first plurality of superconductive (SC) coils, inside an outer circumference and arranged in a planar pattern such as a rectangular pattern,
a second plurality of SC coils, arranged along an outer boundary of the planar pattern, a coil of the first plurality of SC coils having a first in-plane shape and a coil of the second plurality of SC coils having a second in-plane shape, different from the first in-plane shape, wherein the second plurality of SC coils is at least partly arranged inside the outer circumference.

According to a second aspect of the invention, there is provided a superconductive (SC) coil assembly for a magnet assembly of a planar electromagnetic motor, the SC coil assembly comprising multiple SC coils.

According to a third aspect of the invention, there is provided a planar electromagnetic motor comprising a magnet assembly according to the invention, and a coil assembly configured to co-operate with the magnet assembly thereby generating, during use, an electromagnetic force to displace the coil assembly relative to the magnet assembly.

According to a fourth aspect of the invention, there is provided a lithographic apparatus comprising a planar electromagnetic motor according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
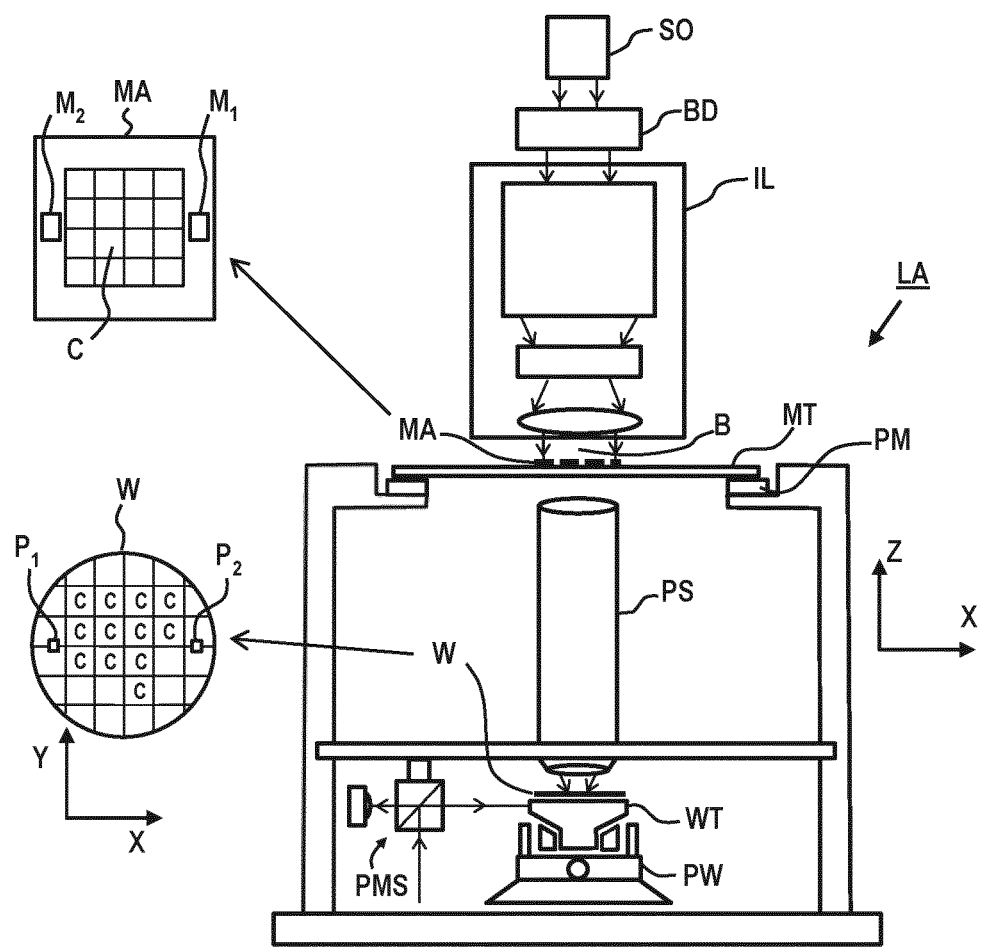
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
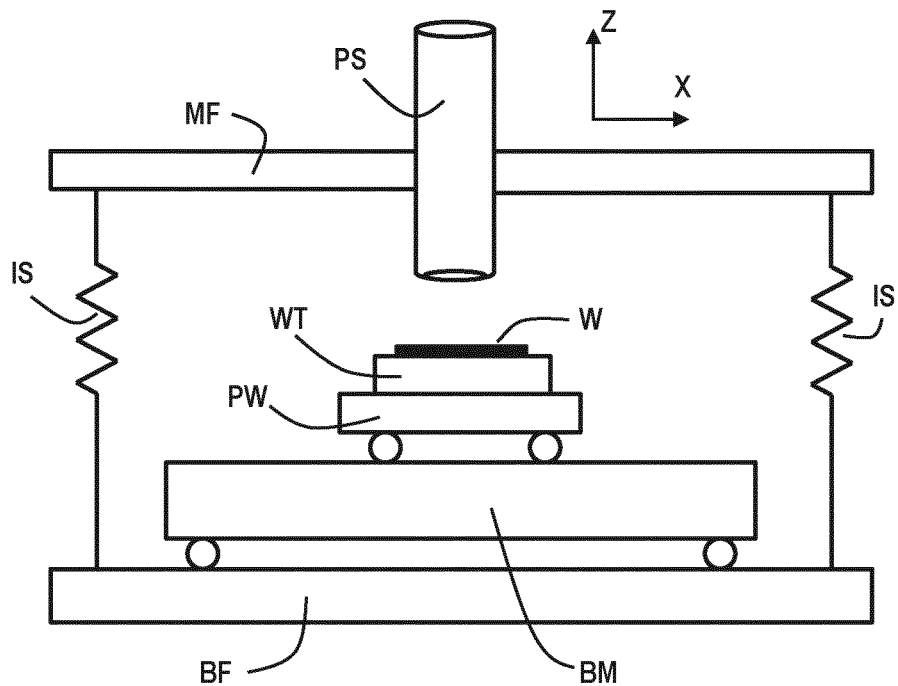
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
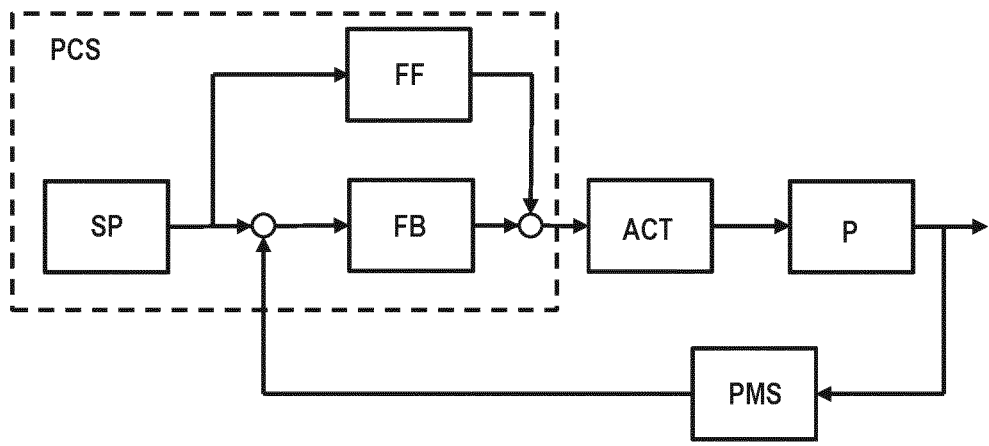
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
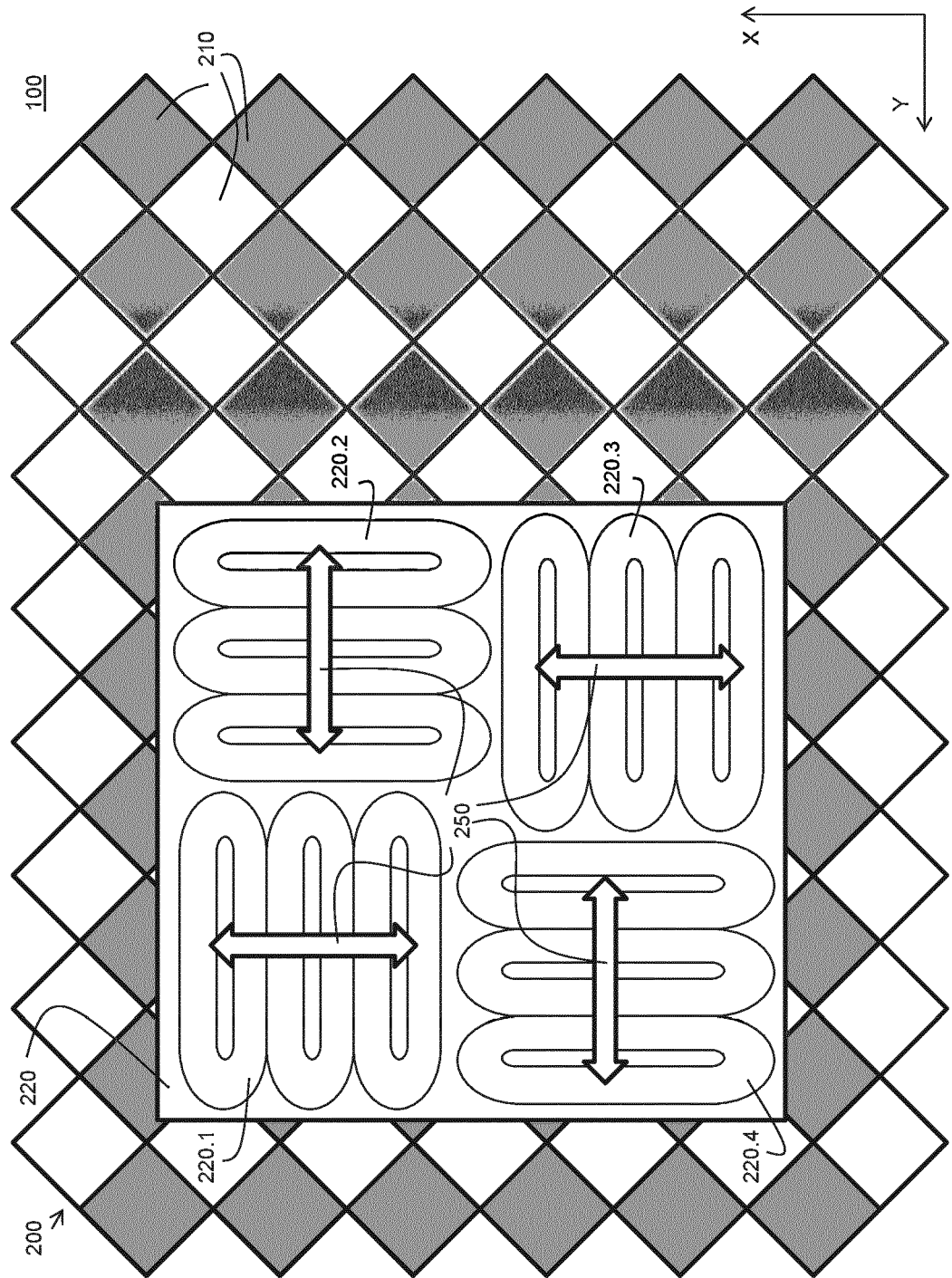
FIG. 4 schematically depicts a top view of a planar electromagnetic motor as known in the art.

In the present invention, an improved electromagnetic motor, in particular a planar electromagnetic motor, is described. Typically, a planar electromagnetic motor comprises a magnet assembly and a coil assembly. In FIG. 4, a top view of a planar motor as known in the art is schematically shown. The planar motor 100 comprises a magnet assembly 200 comprising a plurality of permanent magnets 210 configured to generate a spatially alternating magnetic field in two directions; X-direction and Y-direction. Note that the spatially alternating magnet field will have components in the X-direction, the Y-direction as well as in the Z-direction, perpendicular to the X-direction and the Y-direction. The magnets as indicated by the grey squares have an opposite magnetic polarization compared to the magnets indicated by the white squares. The magnets as indicated by the grey squares may e.g. generate a magnetic field perpendicular to the plane of the drawing and inwards, whereas magnets as indicated by the white squares may e.g. generate a magnetic field perpendicular to the plane of the drawing and outwards.

The planar motor 100 further comprises a coil assembly 220 configured to generate forces in the X-direction and the Y-direction, by providing an appropriate current to the coils or coil sets 220.1, 220.2, 220.3 and 220.4 of the coil assembly 220. In the embodiment as shown, each coil set comprises a triplet of coils. By suitable powering of the coil sets, forces can be generated by the interaction of the currents through the coils of the coil assembly 220 and the magnetic field of the magnet assembly 200. Arrows 250 schematically indicate forces which can be generated by the different coil sets when powered. As will be appreciated by the skilled person, by suitable powering of the different coil sets, the coil assembly, and any object mounted to it, can be displaced and positioned in the indicated XY plane and may be rotated about an axis perpendicular to the XY-plane. It can further be pointed out that by suitable powering of the coil sets, out-of-plane forces, i.e. forces that are not parallel to the XY-plane, can be generated as well. By doing so, a weight of the coil assembly 220 can be compensated and the coil assembly, e.g. together with an object table mounted to it, can be levitated by the generated electromagnetic forces. In general, the coil assembly 220 can thus be positioned relative to the magnet assembly 200 in six degrees of freedom, i.e. three translational degrees of freedom and three rotational degrees of freedom.

Figure 5:
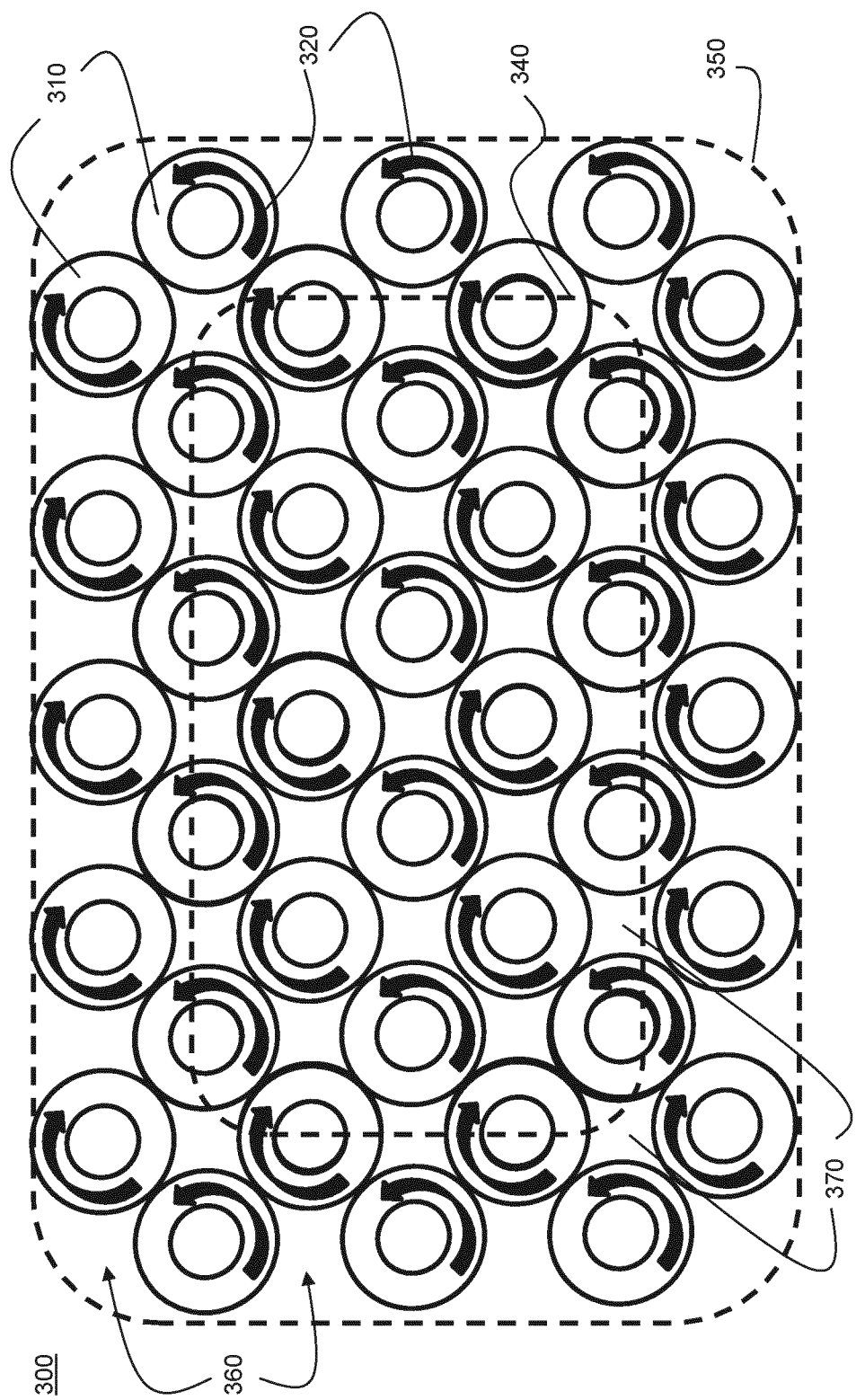
FIG. 5 schematically shows a magnet assembly having superconductive coils.

As an alternative to the use of permanent magnets such as permanent magnets 210 for generating the magnetic field distribution required to operate a planar electromagnetic motor such as planar motor 100, it has been proposed to use superconductive (SC) coils. In such embodiment, circular or cylindrical coils may serve to generate a magnet field along an axial direction of the coils when the coils are supplied with a current. By a suitable arrangement of the coils and the supply currents, one can obtain a magnet assembly that generates, in use, a two-dimensional spatially alternating magnetic field, similar to the magnetic field as generated by the magnet assembly 200 shown in FIG. 4. FIG. 5 schematically shows a top view of a magnet assembly 300 of superconductive (SC) coils 310 which can generate, when powered, a two-dimensional spatially alternating magnetic field. The arrows 320 in the SC coils 310 are indicative for the direction of the current flowing in the SC coils 310.

Despite the fact that such a magnet assembly 300 of superconductive coils 310 is capable of generating a substantially larger magnetic field than a similar array of permanent magnets 210, it has been observed that the magnetic field as generated by such an array is sub-optimal.

It is therefore an objective of the present invention to further improve magnet assemblies for planar motors that are equipped with superconductive coils and to improve the superconductive coils that can be applied in such a magnet assembly.

When designing an electromagnetic motor such as a planar motor, it will be beneficial to ensure that the coil assembly of the motor, e.g. coil assembly 220 shown in FIG. 4, can operate over the entire area covered by the magnet assembly, e.g. magnet assembly 200 shown in FIG. 4. However, at or near the edge or boundary of the magnet assembly, the magnetic field as generated may not have the same desired or required characteristics for the motor to fulfil its requirements. At or near the edge of the magnet assembly 300 or the magnet assembly 200, the magnetic field will gradually suffer edge effects, causing a reduced or inferior interaction with a coil assembly co-operating with it. As such, the area a coil assembly can be operated, relative to the magnet assembly, without adversely affecting the motor performance, will in general be smaller than the area covered by the magnets or SC coils. Merely as an illustration, the dotted line 340 shown in FIG. 5 schematically indicates the operating area of a coil assembly of a planar motor which uses the magnet assembly 300 for the generation of a two-dimensional spatially alternating magnetic field. As such, the area inside the dotted line 340 is the actual useful area for operating the motor, whereas the area inside the outer circumference of the magnet assembly, as indicated by the dotted line 350, correlates to the actual footprint covered by the motor. As such, the variation or diminishing of the magnetic field as generated at or near the edge of the magnet assembly 300 thus causes part of the area covered by the magnet assembly 300 to be inefficient or ineffective.

When considering the distribution of magnets, either permanent magnets 210 or superconductive coils 310, as shown in FIGS. 4 and 5 respectively, it can be observed that the magnet pattern along the edges of the magnet assembly is somewhat serrated or toothed, i.e. there is no smooth edge along the 2D pattern of magnets. Phrased differently, one can observe along the edge of the magnet assembly that small gaps or open areas 360 exist that are not covered by the SC coils 310. It has been observed by the inventors that a non-uniformity or variation of the magnetic field as generated may at least partially be compensated by applying additional SC coils in the open areas 360 along the edge of the magnet assembly. When doing so, one can thus enlarge the useful area 340 for operating the motor. By applying additional SC coils in the open areas 360 along the edge or boundary of the magnet assembly 300, a non-uniformity or variation of the magnetic field as generated near the edge of the magnet assembly can be mitigated.

It can further be pointed out that the additional SC coils that are applied need to have a different shape or size compared to the SC coils 310 used for the generation of the two-dimensional spatially alternating magnetic field. In particular, in order to fit into the open areas such as areas 360, the in-plane shape of the additional SC coils is preferably different, in order to most effectively fill the open areas. As an example, the additional SC coils can e.g. be wedge-shaped or triangular shaped. In this regard, in-plane refers to the plane of the magnet assembly along which the array of SC coils 310 extends. The in-plane shape of a coil can thus be considered the shape which can be seen from a top view.

As such, in accordance with an aspect of the present invention, there is provided a magnet assembly for a planar electromagnetic motor, whereby the magnet assembly comprises a first set of SC coils, e.g. for generating a two-dimensional spatially alternating magnetic field, and a second set of SC coils, which may also be referred to as additional or auxiliary SC coils, for improving the uniformity of the magnetic field at or near the edge of the magnet assembly.

Such a magnet assembly may thus be described as comprising:
  a first plurality of superconductive (SC) coils, arranged in a planar pattern, and
  a second plurality of SC coils, arranged along an outer boundary of the planar pattern, a coil of the first plurality of SC coils having a first in-plane shape and a coil of the second plurality of SC coils having a second in-plane shape, different from the first in-plane shape.

In an embodiment of the present invention, the second plurality of SC coils as applied in the magnet assembly according to the invention is configured to, in use, at least partially compensate a non-uniformity of a magnetic field as generated, in use, by the first set of SC coils, the non-uniformity occurring at or near the outer boundary of the planar pattern. As explained above, by at least partially filling the gaps or open spaces along the edge of the magnet assembly with additional SC coils, the non-uniformity near the boundary or edge of the magnet assembly can be mitigated, thereby increasing the useful or effective operating area of the planar motor.

In particular, in such embodiment, the second plurality of SC coils is configured to, in use, at least partially compensate a non-uniformity of a magnetic field, as generated, in use, by the first set of coils, the non-uniformity occurring at or near the outer boundary of the planar pattern.

With reference to FIG. 5, the application of additional SC coils along the edge of the magnet assembly 300 may thus result in an enlarged useful area 340 of a planar motor using the magnet assembly 300 for the generation of a two-dimensional spatially alternating magnetic field.

In an embodiment of the present invention, the second set of SC coils are dimensioned and sized in such manner that they do not extend beyond the outer circumference of the magnet assembly 300, in particular the outer circumference 350 of the magnet assembly described by the first set of SC coils. Referring to FIG. 5, the outer circumference 350 of the magnet assembly 300 as described by the first set of SC coils 310 can e.g. be defined as the smallest rectangle enclosing all the SC coils 310. By ensuring that the second set of SC coils do not extend beyond the outer circumference of the magnet assembly 300, the footprint of the magnet assembly 300 is substantially not affected by the addition of the second set of SC coils.

According to another aspect of the present invention, there is provided a magnet assembly for a planar motor, the magnet assembly having a plurality of SC coils, e.g. for generating a two-dimensional spatially alternating magnetic field, said SC coils having a substantially polygonal shape. In particular, in an embodiment of the present invention, the plurality of SC coils as applied are shaped such that an outer boundary of the in-plane shape of the coils has a substantially polygonal shape. Referring to the above described embodiment having a first plurality of SC coils with a first in-plane shape and a second plurality of SC coils with a second in-plane shape, an embodiment of the present invention may thus comprise a magnet assembly whereby either the first in-plane shape or the second in-plane shape, or both the first in-plane shape and the second in-plane shape have an outer boundary with a substantially polygonal shape.

It is submitted that by using SC coils having a substantially polygonal shape better use can be made of the available footprint of the magnet assembly. Referring to FIG. 5, it can be pointed out that there are gaps or open areas 370 between the circular SC coils 310 of the magnet assembly 300 which do not contribute to the generation of the magnetic field. Phrased differently, the fill-factor of the SC coils 310 used for the generation of the magnetic field is suboptimal.

It has been observed by the inventors that by using a different shape of SC coil, in particular when using a polygonal shape, an improved magnetic field generation can be realised. In an embodiment of the present invention, the outer boundary of the first in-plane shape has a substantially triangular, rectangular, octagonal or hexagonal shape.

Figure 6A:
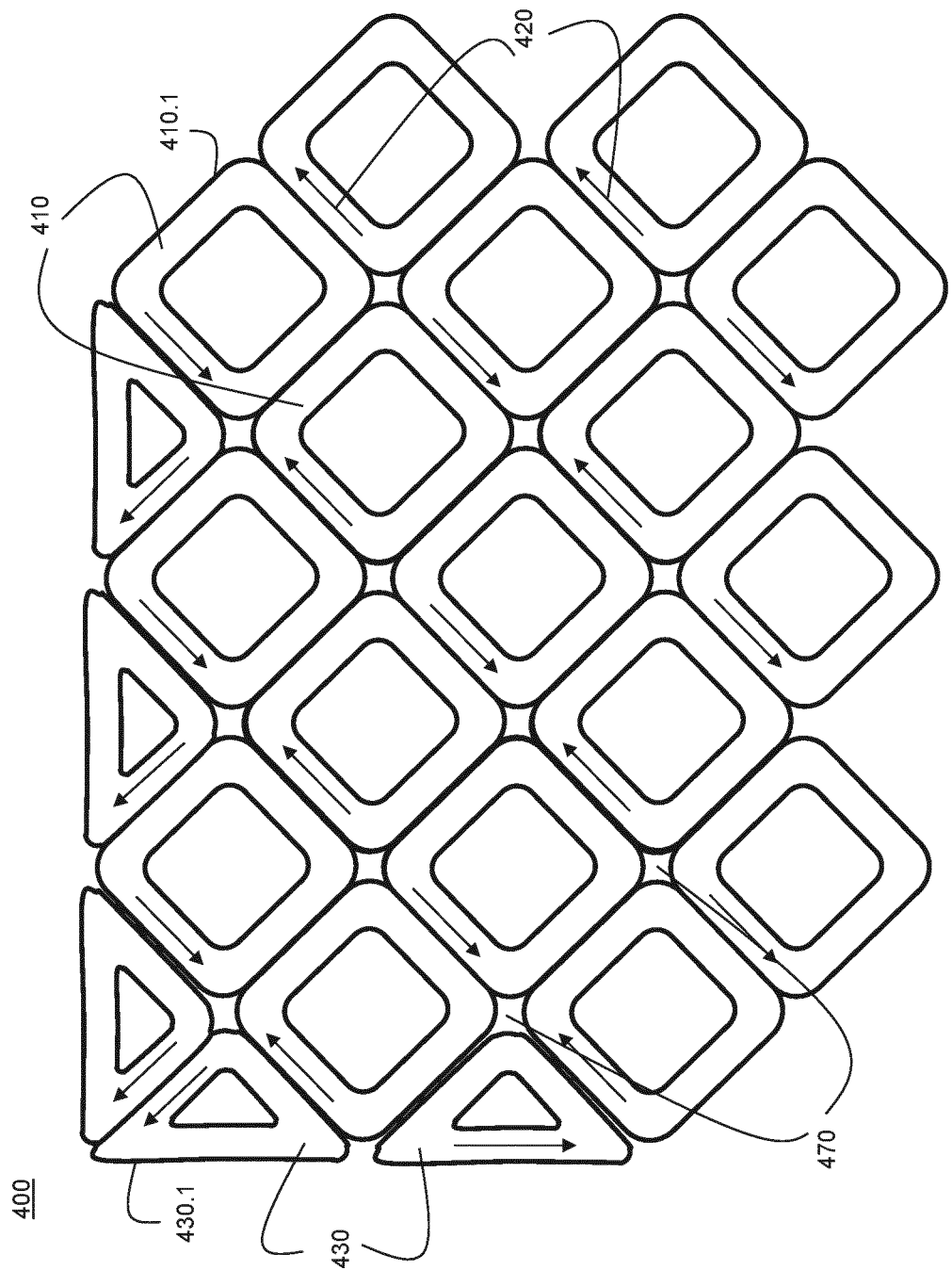
FIGS. 6a-6c schematically show magnet assemblies according to the present invention.

A first example of a magnet assembly according to the present invention, whereby a polygonal shape is applied, is schematically shown in FIG. 6a. FIG. 6a schematically shows part of a magnet assembly 400 according to an embodiment of the present invention, the magnet assembly 400 comprises a first plurality of SC coils 410, said SC coils 410 having a substantially polygonal outer boundary, in particular a rectangular or square outer boundary 410.1.

As can be seen, the use of substantially square SC coils 410, rather than substantially circular SC coils 310 shown in FIG. 5 results in a more effective use of the footprint of the magnet assembly, in that the gaps 470 between adjacent SC coils 410 is substantially smaller than the gaps 370 between adjacent circular SC coils 310 shown in FIG. 5. The arrows 420 in the SC coils 410 are indicative for the direction of the current flowing, during use, through the SC coils SC 410. As can be seen, the applied current directions result in a spatially alternating pattern of currents flowing clockwise and counter clockwise, resulting in a spatially alternating magnetic field, commonly described as a two-dimensional array of North and South poles, whereby each pole can be associated with a SC coil 410 of the magnet assembly 400.

In the embodiment as shown in FIG. 6a, the magnet assembly 400 further comprises a second set or plurality of SC coils 430 arranged along an edge of the magnet assembly 400, coils 430 of said second set of SC coils having a substantially triangular shape. In particular, the outer boundary 430.1 of the in-plane shape of coils 430 of the second plurality of coils has a substantially triangular shape. It can be shown that the use of the second set of SC coils mitigates a non-uniformity of the magnetic field as generated by the first set of coils 410, thereby increasing the effective operating area or useful area of the magnet assembly when used in a planar motor.

Although the example shown in FIG. 6a makes use of rectangular and triangular coils, it will be appreciated by the skilled person that, as already mentioned above, other in-plane shapes or particular combinations of different in-plane shapes may also be applied. The use of such other polygonal shaped coils may also provide in an improved fill-factor of the available footprint and/or an improved homogeneity of the magnetic field at or near the edge or boundary of the magnet assembly.

Figure 6B:
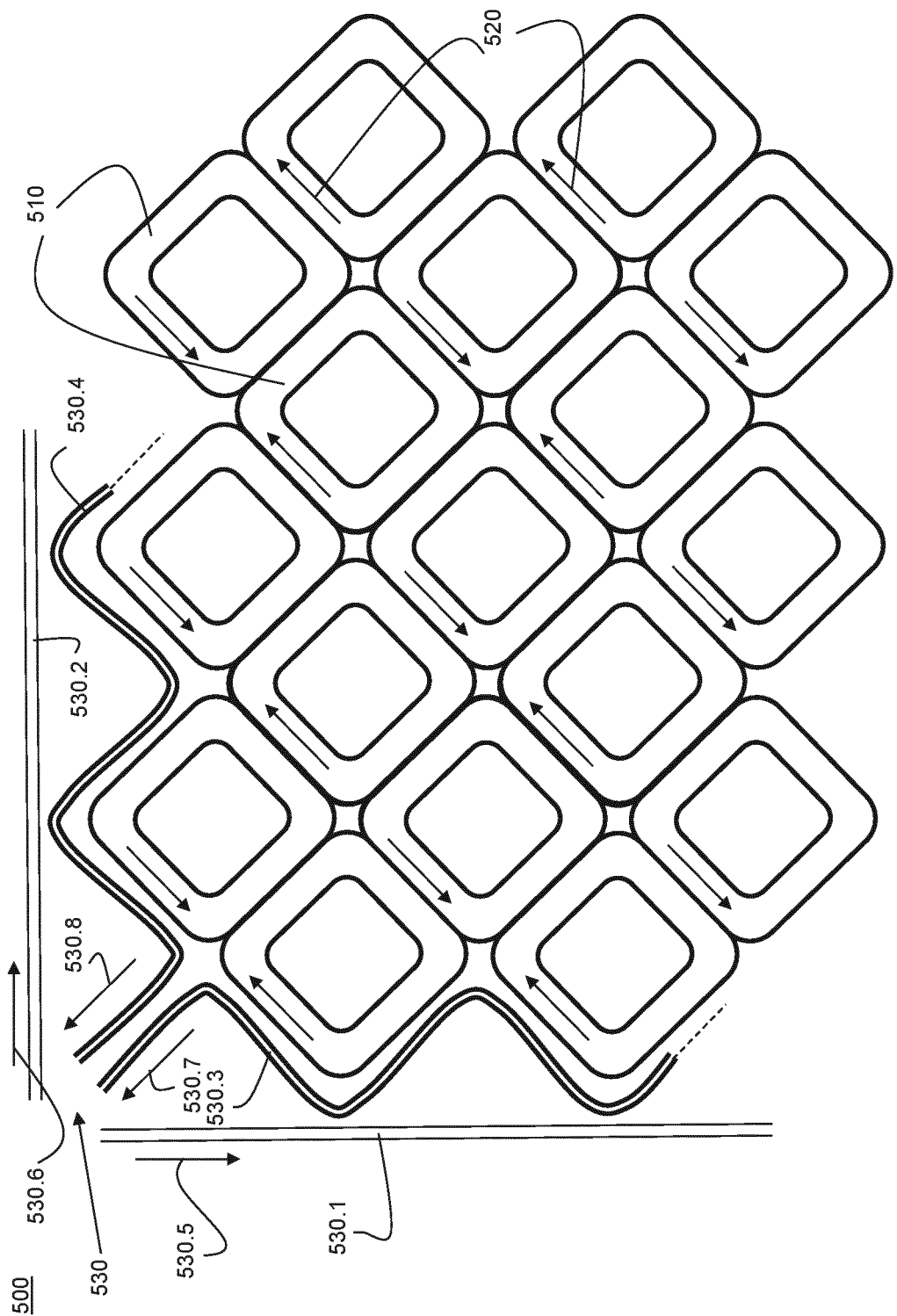

With respect to the use of the second set or plurality of SC coils 430 as arranged along an edge of the magnet assembly 400, it can be pointed out that alternative coils or windings can be applied resulting in a similar effect on the homogeneity of the magnetic field at or near the edge. FIG. 6b schematically shows such an arrangement.

FIG. 6b schematically shows a magnet assembly 500 including a first set of SC coils 510, which can be similar or the same as SC coils 410. Arrows 520 indicating a direction of the current, in use, flowing in the SC coils 510. Rather than using triangular coils such as coils 430 shown in FIG. 6a, the magnet assembly 500 further comprises a second set of SC coils or windings 530 which follow a straight path or trajectory, such as SC coils 530.1 and 530.2 or which follow a meandering or zig-zag path or trajectory, such as SC coils 530.3 and 530.4. Arrows 530.5, 530.6, 530.7 and 530.8 indicating the current direction in the respective SC coils 530.1, 530.2, 530.3 and 530.4. As will be appreciated by the skilled person, a magnetic field as generated by the second set of SC coils 530 as schematically shown in FIG. 6b may be similar to the magnetic field as generated by the SC coils 430 shown in FIG. 6a. Compared to the SC coils 430, the SC coils 530 as schematically shown in FIG. 6b do not have or require comparatively sharp edges or corners. A required bending radius of the SC coils 530 can thus be more easily achieved.

Figure 6C:
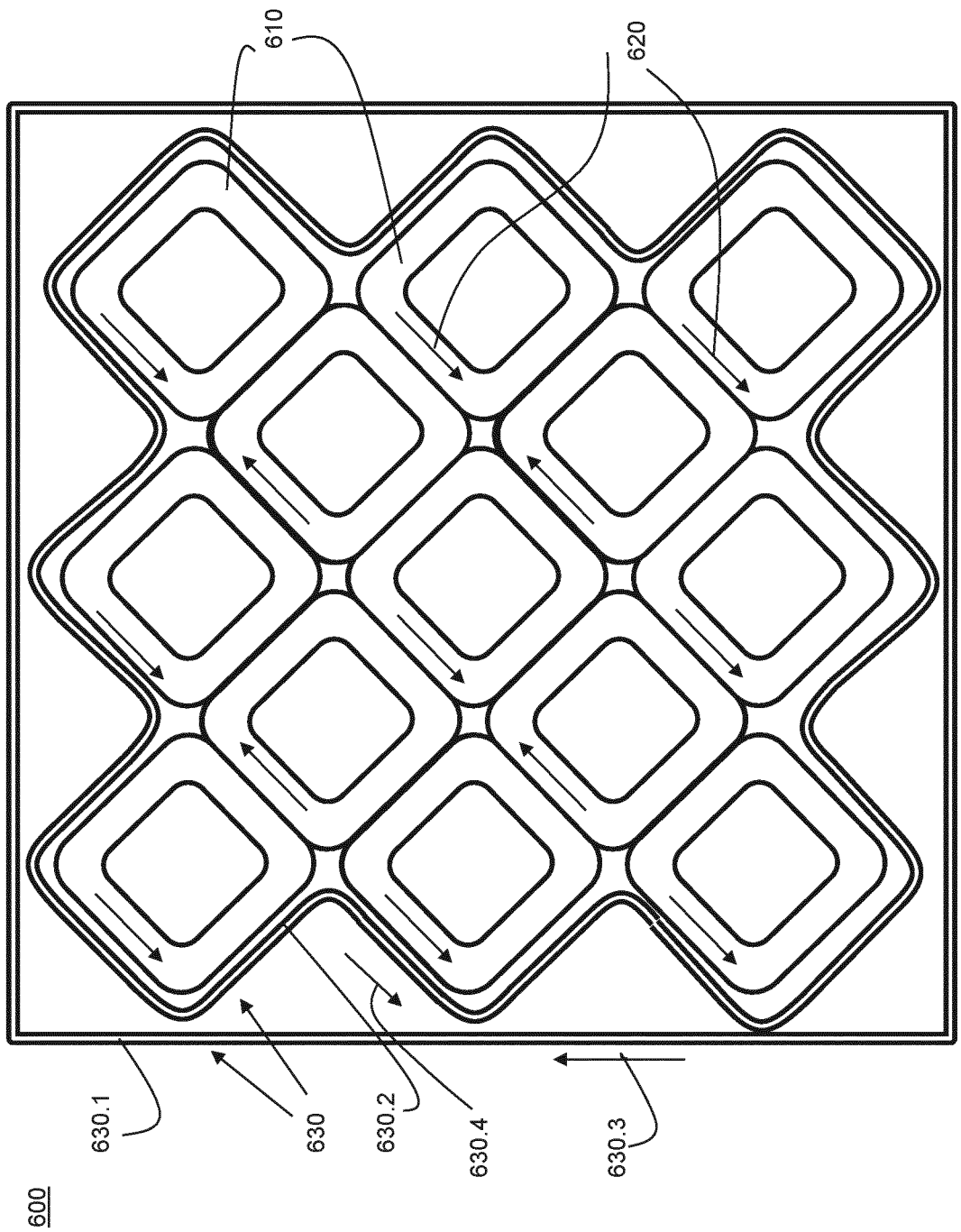

FIG. 6c schematically shows yet another alternative coil or winding arrangement which can be applied in an embodiment of the present invention. FIG. 6c schematically shows a magnet assembly 600 including a first set of SC coils 610, which can be similar or the same as SC coils 410. Arrows 620 indicating a direction of the current, in use, flowing in the SC coils 610. Rather than using triangular coils such as coils 430 shown in FIG. 6a, the magnet assembly 600 further comprises a second set of SC coils 630. The second set of SC coils comprises a first SC coil 630.1 having a substantially rectangular in-plane shape and a second SC coil 630.2 which follow a meandering or zig-zag path or trajectory along the circumference of the SC coils 610. In the embodiment as shown, both coils 630.1 and 630.2 surround the first set of SC coils 610. Arrows 630.3 and 630.4 indicate the direction of current flowing in respective SC coils 630.1 and 630.2 during use. As will be appreciated by the skilled person, a magnetic field as generated by the second set of SC coils 630 as schematically shown in FIG. 6c may be similar to the magnetic field as generated by the SC coils 430 shown in FIG. 6a. Compared to the SC coils 430, the SC coils 630 as schematically shown in FIG. 6c do not have or require comparatively sharp edges or corners. A required bending radius of the SC coils 630 can thus be more easily achieved.

It can further be pointed out that the use of polygonal shaped coils enables a close or closer packaging of the SC coils which enables an improved force transmission from coil to coil and facilitates the mechanical mounting of the coils such that interaction forces between coils can be accommodated. In this respect, it can be pointed out that, during use, substantial in-plane forces act on the SC coils, in particular for the SC coils that are at or near the edge of the magnet assembly.

According to yet another aspect of the present invention, various improvements are proposed to the SC coils that can be used for a magnet assembly such as a magnet assembly according to the invention.

As a first example, a SC coil is disclosed whereby an outer width of the coil varies along an axial direction substantially perpendicular to a plane of the planar pattern.

Figure 7:
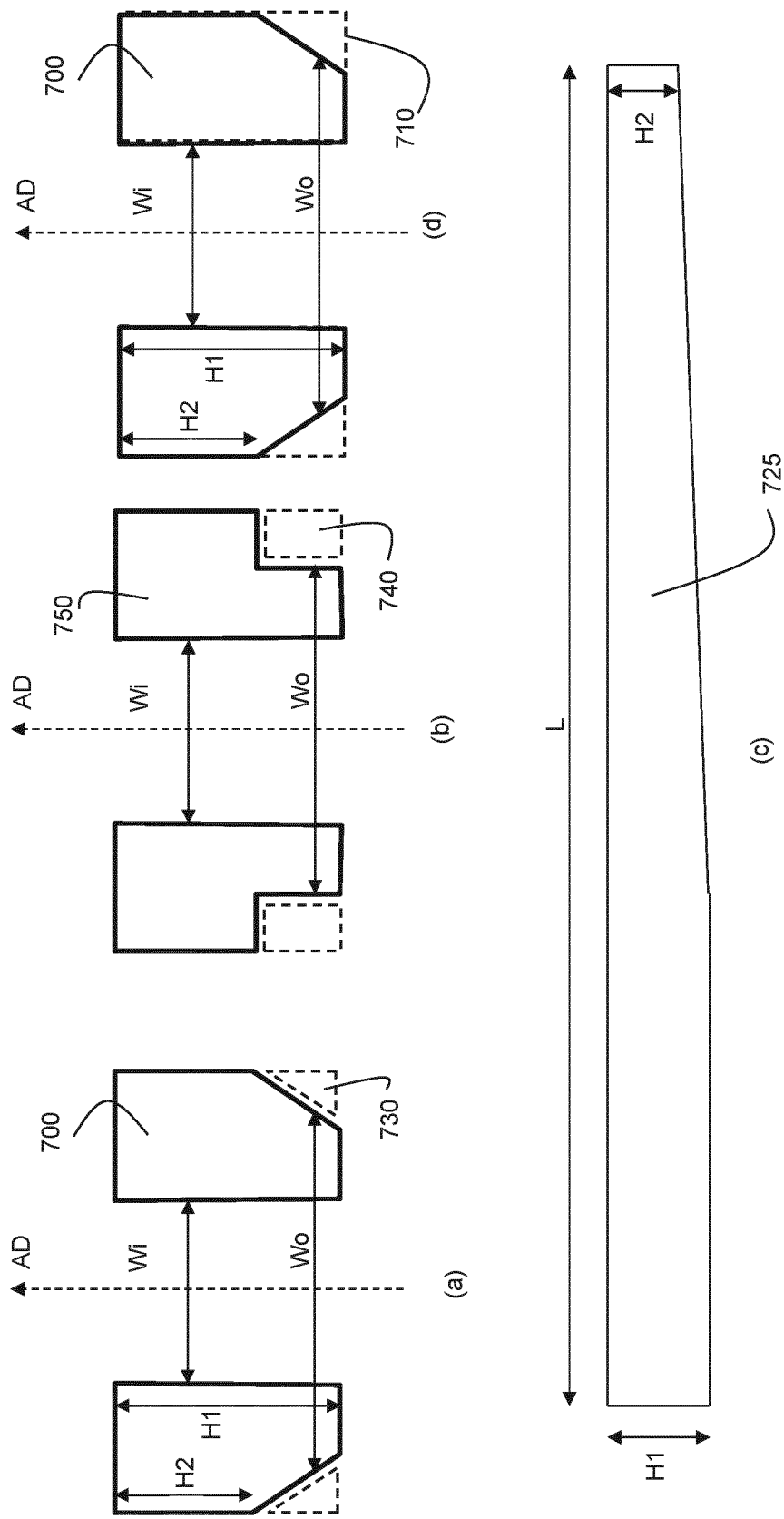
FIGS. 7 and 8 schematically show coils and coil assemblies according to the present invention, as can be applied in magnet assemblies according to the invention.

Such a SC coil is schematically shown in FIG. 7. FIGS. 7(a) and 7(b) schematically show cross-sectional views of two SC coils 700, 750. In FIGS. 7(a) and 7(b), the dotted line AD represent the axial direction of the SC coils 700, 750. It may e.g. represent an axis about which the coil is wound. The axial direction AD may also be referred to as the longitudinal axis of the coils 700, 750. Note however that the coil need not be a circular or cylindrical coil, the in-plane shape of the SC coil 700 or coil 750, i.e. the shape in a direction substantially perpendicular to the axial direction AD, can e.g. be a polygonal shape, as discussed above.

As schematically shown in FIG. 7, the outer width Wo of the SC coils 700, 750 varies along the axial direction AD. SC coil 700 has a portion where an outer width (Wo) of the coil changes gradually along the axial direction. Such a portion may also be referred to as a tapered portion. SC coil 700 as schematically shown in FIG. 7(a) can thus be described as a coil having a cross-section which comprises a tapered shape. SC coil 750 has a more abrupt change in outer width Wo along the axial direction AD.

In the embodiments as shown in FIGS. 7(a) and (b), the inner width (Wi) of the coil is substantially constant along the axial direction (AD).

With respect to the manufacturing of such coils 700, 750, it can be pointed out that SC coils are typically wound using a tape or ribbon shaped superconductor. Such a tape or ribbon shaped superconductor may be wrapped or enclosed by an insulating layer. Alternatively, the superconductive tape or ribbon can be enclosed by a non-insulating layer or an electrically conducting layer such as a metal layer.

In an embodiment, a SC coil 700, 750 having a varying outer width Wo can be manufactured from a tape-shaped superconductor having a height H that varies along its length L. Such a conductor 725 is schematically shown in FIG. 7(c). FIG. 7(c) schematically shows a tape-shaped conductor 725 having a length L and an initial height H1, corresponding to the height of the SC coil 700 at the inside of the SC coil, the height gradually changing to a height H2, the height of the SC coil 700 at the outside of the SC coil. In case a discrete or more abrupt change in height is applied to the tape-shaped superconductor 725, a SC coil as shown in FIG. 7(b) can be obtained.

As an alternative, a SC coil having a varying width along the axial direction or longitudinal axis can also be obtained by:

Winding a SC coil using a tape-shaped superconductor having a substantially constant height along its length, and After winding the SC coil, removing any excess material to arrive at the desired cross-sectional shape.

FIG. 7(d) schematically illustrates this process for a coil 700 according to FIG. 7(a). In FIG. 7(d), the SC coil 700 is obtained by, in a first step, winding a SC tape having a height H1 along its entire length to arrive at a coil with a rectangular cross-section, as indicated by the dotted line 710, followed by a second step of removing any excess material to arrive at the desired cross-section. The removal of the excess material can e.g. be realised by a suitable cutting operation.

With respect to SC coils having a varying outer width Wo, such as coils 700 or 750, the following advantages can be mentioned.

First of all, it can be pointed out that SC coils having a varying outer width Wo operate with a more favourable current distribution. As will be understood by the skilled person, the coils 700 and 750 as schematically described above will have a different current distribution in the inner windings compared to the outer windings. Since the outer windings have a smaller height, the current density at the outside of the coil, or in the outer windings of the coil, will be higher than in the inner windings. It has been observed that such a current distribution enables the generation of a similar, magnetic field using less volume for the SC coil. In this respect, it can be pointed out that an upper limit for the current density may be smaller in the inner windings of the coil than in the outer windings. As will be appreciated by the skilled person, the current density applied in a SC coil has an upper limit to maintain the superconductor in a superconductive state, whereby said upper limit is, among others, dependent on the local magnetic field at the location of the superconductor. As such, it has been observed that said upper limit for the applicable current density is not constant across the entire cross-section of a SC coil. In particular, it has been observed that a higher current density is allowed in the outer windings of the coil, compared to the inner windings. As such, the coils as schematically shown in FIG. 7 can be considered to have an optimized cross-sectional shape resulting in an improved current and current density distribution. The SC coils 700 and 750 may thus be operated with the same Ampère-turns as a coil having a superconductor having the same height along its length, but requiring less volume.

Upon review of the cross-sections of the SC coils 700 and 750, one can consider these cross-sections as reduced cross-sections compared to a rectangular cross-section one would obtain when merely winding the coil using a tape-shaped conductor having a constant height. Phrased differently, the construction of a SC coil having a varying outer width Wo has vacated a volume which otherwise would have been occupied by the SC coil. In FIG. 7(a), said vacated volume is indicated by the dotted triangle 730, In FIG. 7(b), said vacated volume is indicated by the dotted rectangle 740.

In an embodiment of the present invention, said vacated volume 730 or 740 is used for improving the thermal conditioning of the SC coil 700, resp. the SC coil 750. In particular, in an embodiment, the vacated volume 730, 740 can be used for accommodating a cooling structure such as a cooling fin, or a cooling channel which can be provided with a coolant.

Alternatively, the vacated volume 730 or 740 could be occupied by a further SC coil. Yet alternatively, the vacated volume can remain empty. In such case, the mass of the magnet assembly in which the SC coil is used can be reduced.

It can be pointed out that a SC coil 700 or SC coil 750 as schematically shown in FIG. 7 can be applied in a magnet assembly such as a magnet assembly according to the invention, whereby the SC coil 700 is either used in the first plurality of SC coils or in the second plurality of coils, or in both.

As a second example of a SC coil having improved characteristics and which can advantageously be applied in a magnet assembly according to the present invention, is a SC coil which comprises multiple coils. In such embodiment, when applied in a magnet assembly according to the present invention, a magnetic pole of the magnetic field is not generated by a single coil, e.g. one of the SC coils 410 shown in FIG. 6, but rather is generated by a combination of multiple coils. Within the meaning of the present invention, such a combination of multiple SC coils configured to be used in a magnet assembly for the generation of a magnetic pole, is referred to as a superconductive (SC) coil assembly.

In an embodiment, the multiple coils of such a SC coil assembly can e.g. have the same axial direction or longitudinal axis.

The following Figures schematically illustrate various embodiments of SC coil assemblies according to the present invention.

FIG. 8(a) schematically shows a cross-sectional view of a SC coil assembly 800 according to the present invention, which comprises an inner coil 810 and an outer coil 820. In the embodiment as shown, the inner coil 810 has a height Hi, whereas the outer coil 820 has a height Ho.

In the embodiment as shown, Hi>Ho.

It can be pointed out that the SC coil assembly 800 as schematically shown in FIG. 8(a) can provide substantially the same or similar advantages as the SC coils 700 and 750 as described with reference to FIG. 7, and provide addition design freedom to further optimize the performance of the SC coil assembly. In particular, as will be appreciated by the skilled person, the SC coils 810 and 820 can, in an embodiment, be powered by a separate power supply, enabling an independent selection of the current and current density in the coils. As such, one can select the current density in the outer coil 820 to be somewhat higher than the current density in the inner coil. Alternatively, the coils 810 and 820 can be connected in series and powered by the same power supply. Assuming a larger cross-section of the windings in the inner coil 810, the current density in the inner coil 810 would be smaller than the current density in the outer coil 820. Note however that when multiple coils are applied, they do not need to be manufactured from the same kind of superconductor. The use of multiple coils in the SC coil assembly according to the present invention provides an additional design freedom in that each coil can be designed independently with respect to dimensions or materials used. It can also be pointed out that the different coils can also have different winding configurations. A winding configuration can e.g. involve the number of windings of a coil but can also involve the winding of two or more superconductors in parallel. As an example, one can e.g. wind the inner coil 810 using two superconductor tapes in parallel, whereas outer coil 820 is wound using only one superconductor tape. By doing so, a further differentiation of the current densities in the different coils of the SC coil assembly can be established.

In the embodiment as shown in FIG. 8(a), it can further be seen that, due to the selection of Hi>Ho, and by arranging the SC coils 810 and 820 such that their top surfaces TSi and Tso are arranged flush, a volume 830 is available which can be used to improve the thermal conditioning of the SC coil assembly, in a similar manner as the volumes 730 and 740 as discussed with reference to FIG. 7.

Figure 8:
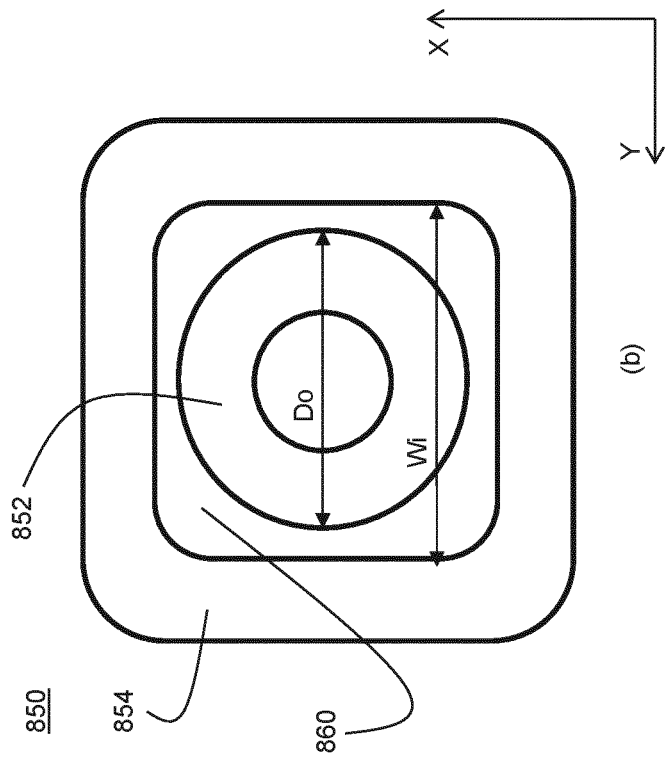
Figure 8:
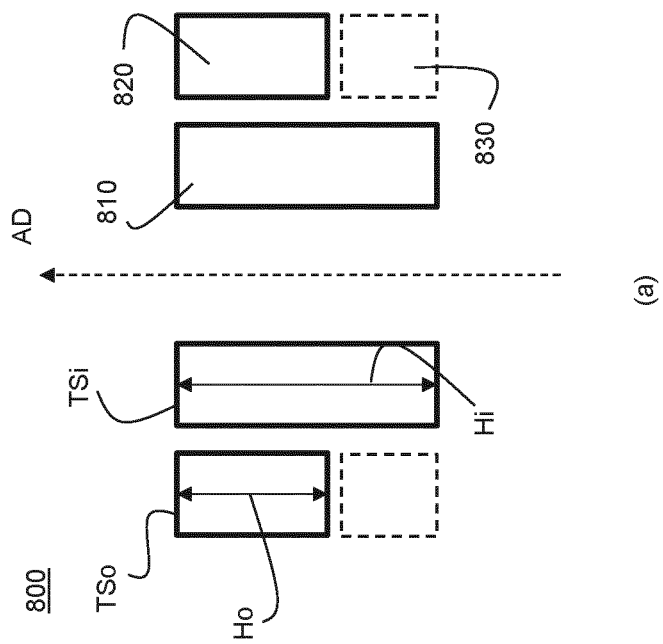

In an embodiment, the different SC coils as applied in a SC coil assembly according to the present invention may either have the same or substantially the same in-plane shape or may have a different in-plane shape. Referring to FIG. 8(*a*), SC coils 810 and 820 may thus have e.g. cylindrical coils having a common axis of symmetry AD. Alternatively, the SC coils 810 and 820 may both have substantially the same polygonal shape, e.g. a triangular, rectangular, hexagonal or octagonal in-plane shape.

Alternatively, as illustrated in FIG. 8(*b*), the different SC coils applied in a SC coil assembly according to the present invention may have a different in-plane shape. FIG. 8(*b*) schematically depicts an in-plane view of a SC coil assembly 850 according to the present invention, the SC coil assembly 850 comprises an inner coil 852 and an outer coil 854. In the embodiment as shown, the inner coil 852 has a substantially circular or cylindrical shape, whereas the outer coil 854 has a substantially rectangular or square shape. It can be pointed out that such a combination of a polygonal SC coil and a cylindrical SC coil provides an additional design freedom. By using a polygonal shaped outer SC coil 854, a favourable fill-factor can be obtained when the SC coil assembly is used in a magnet assembly according to the invention. As already pointed out, such a close packing of the coils further results in a more favourable force transmission from coil to coil. With reference to FIG. 8(*b*), it can be pointed out that a favourable fill-factor may e.g. be obtained by selecting an inner width Wi of the coil 854 to substantially correspond to the outer diameter Do of the inner coil 852. In an embodiment, the spaces or space 860 between the inner SC coil 852 and the outer SC coil 854 is preferably filled with a support structure, which can e.g. comprise suitable shaped wedges or wedge-shaped inserts to ensure a well-defined relative position between the SC coils 852 and 854. It can further be pointed out that a cooling function can also be incorporated in the support structure or by the support structure. Also, similar to the SC coils 810 and 820, the SC coils 852 and 854 can have different cross-sectional dimensions, can have a different winding configuration, can be made from different materials or different superconductors. The SC coils 852 and 854 can be wound from a single superconductor in series, or can be wound separately.

Figure 9:
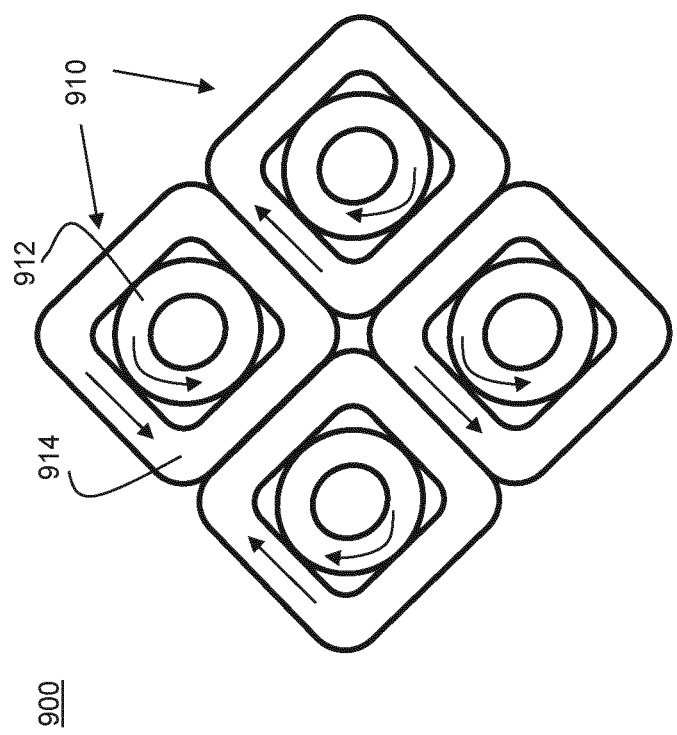
FIG. 9 schematically shows a portion of a magnet assembly according to an embodiment of the present invention.

When applied in a magnet assembly according to the present invention, a plurality of SC coil assemblies such as SC coil assembly 850 can be used for the generation of a two-dimensional spatially alternating magnetic field. FIG. 9 schematically shows a portion of such a magnet assembly 900, whereby 4 SC coil assemblies 910 are closely packed, each SC coil assembly 910 comprising a cylindrical inner SC coil 912 and a polygonal outer SC coil 914, in particular a square outer SC coil. The arrows in the SC coils are indicative for the current direction in the coils.

In yet another embodiment of the SC coil assembly according to the present invention, the SC coil assembly comprises a plurality of coils arranged along the axial direction. Again, said plurality of coils can have different characteristics such as different winding configurations, sizes and/or materials used.

Figure 10:
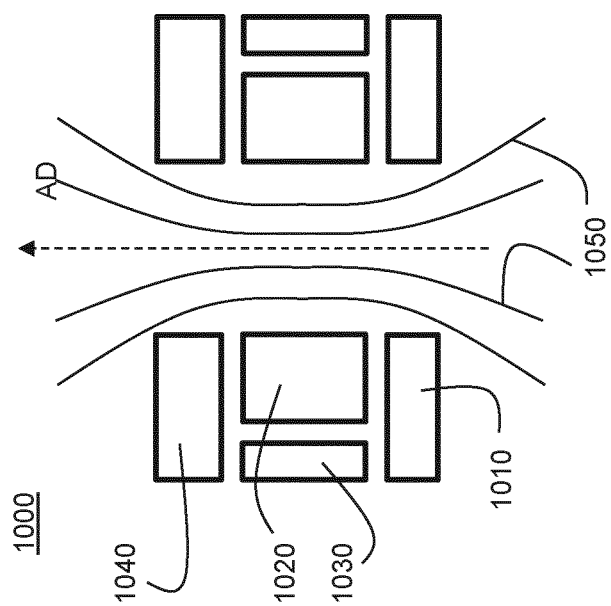
FIG. 10 schematically shows a cross-sectional view of a SC coil assembly according to the invention.

FIG. 10 schematically shows a cross-sectional view of a SC coil assembly according to the invention whereby multiple coils are used, including multiple coils arranged along the axial direction. In particular, FIG. 10 schematically shows a cross-sectional view of a SC coil assembly 1000 comprising 4 coils 1010, 1020, 1030, 1040.

In the embodiment as shown, SC coil 1010 may be referred to as a bottom coil, SC coil 1040 may be referred to as a top coil, SC coils 1020 and 1030 can be referred to as intermediate coils arranged in between the bottom coil 1010 and the top coil 1040 along the axial direction AD. In the pair of intermediate coils 1020, 1030, coil 1020 can be referred to as the inner intermediate coil, whereas coil 1030 can be referred to as the outer intermediate coil. In a similar manner as described above, the different coils of the SC coil assembly 1000 can have different characteristics such as different winding characteristics, different sizes and/or different material characteristics. With respect to the latter, it can be pointed out that it may be advantageous to apply superconductors with different grain orientations for the different coils. In this respect, it can be pointed out that the current carrying capability of a superconductor strongly depends on the magnetic field orientation at the location of the superconductor. In particular, the current carrying capabilities of a superconductor can e.g. be 4 times higher at locations where the local magnetic field, also referred to as the B-field, is substantially parallel to the surface of the tape-shaped superconductor. As such, when designing a SC coil assembly for use in a magnet assembly, it may be advantageous to take account of the local orientation of the magnetic field as generated. In FIG. 10, some magnetic field lines 1050 are schematically shown. When an expected magnetic field distribution of the SC coil assembly is known it can be taken into account when e.g. selecting the allowable current densities in the different coils. As can be seen in FIG. 10, the intermediate coils 1020, 1030 are likely to experience a magnetic field that is substantially parallel to the surface of the tape or ribbon shaped superconductor used to wind the coils. SC coils 1010 and 1040 however experience a magnetic field that has a radial component as well. In view of this magnetic field distribution, one can e.g. apply a larger current density in SC coils 1020 and 1030 compared to coils 1010 and 1040. Alternatively, one can apply superconductors having a different grain orientation for the different coils of the SC coil assembly. By doing so, the allowable current density in the coils can be increased. In particular, when a suitable grain orientation is selected for the grain orientation of the superconductor of coils 1010 or 1040, the current carrying capabilities of these coils can be increased. As such, in an embodiment of the present invention, a SC coil assembly is provided, whereby coils having a different grain orientation is applied, thereby improving the current carrying capabilities of the coils of the SC coil assembly. In an embodiment, a superconductor as applied in a top coil of the SC coil assembly may thus have a different grain orientation than a superconductor applied in a bottom coil or an intermediate coil applied in the SC coil assembly.

In an embodiment of the present invention, the SC coils as applied, either in the magnet assembly according to the invention or in the SC coil assembly according to the invention, make use of a non-insulated or metal-insulated superconductor. It has been observed by the inventors that the application of such a superconductor in a magnet assembly for a planar electromagnetic motor may provide additional advantages. It can e.g. be pointed out that omitting an insulating layer around the superconductive tape or ribbon allows the application of a higher current density and results in a higher mechanical strength. Further advantages include improved mechanical and thermal properties, an increased robustness for local defects in the superconductive layer and a self-protection capability. In particular, it can be pointed out that a cooling of the superconductor is improved and facilitated. When an insulation layer is applied to make a SC coil, each turn of the coil is fully insulated both electrically and thus also thermally from the neighboring turn. In case a defect occurs in the superconducting layer, a current can only flow through a stabilizing layer of said turn, causing significant local ohmic losses. Because the insulation layer also blocks a possible heat flow, a local hotspot may occur, causing a quench, i.e. an uncontrollable transition from a superconducting state to normal ohmic properties, in the superconductor.

It can further be pointed out that the different mechanical properties of an insulation layer, e.g. comprising polyimide, w.r.t. the other layers such as Hastelloy or any steel variant as a carrier and Copper as a stabilization layer, may cause the superconductor to be very anisotropic.

This poses a significant challenge to the mechanical design of a superconducting magnet in a typical array or grid arrangement as required for a linear or planar motor. As an example, the interaction forces between 2 neighboring SC coils may be such that a delamination of the superconducting coils may occur. Additionally, in the application in a precision drive such as a positioning device used in a lithographic apparatus, the tolerances and positioning accuracy of the SC coils are to be kept within strict boundaries to limit generated force inaccuracies. The use of materials that are rather soft such as polyimide may then be a hindrance. Further, it can be mentioned that in a precision drive such as a positioning device of a lithographic apparatus, the eigenfrequency and eigenmodes of the mechanics determine achievable bandwidths for a control system of the drive. Again the application of a comparatively "soft" insulation layer will limit the achievable mechanical eigenfrequencies and thus the achievable bandwidth to control the positioning device.

As such in an embodiment of the present invention, use is made of SC coils that do not have an insulating layer.

It can further be pointed out that the omission of the insulating layer causes that there is less control over the generation of Eddy currents in the conductive layers surrounding the superconductor. In this respect, it can be pointed out that, when the magnet assembly according to the present invention is applied in a planar motor according to the present invention, an electromagnetic interaction between the magnet assembly of the planar motor and a coil assembly of the planar motor, such as a coil assembly 220 shown in FIG. 4, may cause the generation of such Eddy currents. In order to mitigate this effect, it is proposed to, in an embodiment of the present invention, arrange an electrically conductive layer, foil or plate, on top of the top surfaces of the SC coils or SC coil assemblies used in the magnet assembly. By doing so, any Eddy currents will primarily be generated in the electrically conductive layer, foil or plate, rather than in the SC coils or SC coil assembly. By doing so, it is easier to remove the occurring losses and maintain a temperature of the SC coils or SC coil assemblies of the magnet assembly at a desired value, e.g. at substantially constant value or within specific boundaries.

In case the Eddy currents are caused by an electromagnetic interaction between the magnet assembly of a planar motor and a coil assembly of such a planar motor, the design of such an electrically conductive layer may e.g. take account of the operating area or operating range of the coil assembly relative to the magnet assembly.

In an embodiment, the magnet assembly according to the present invention can be used in a planar electromagnetic motor. Such a planar motor may further comprise a coil assembly that is configured to co-operate with the magnet assembly thereby generating, during use, an electromagnetic force to displace the coil assembly relative to the magnet assembly. As an example, the coil assembly 220 shown in FIG. 4 or a similar coil assembly could be applied in a planar motor according to the present invention. Due to the use of the magnet assembly according to the present invention, such a planar motor would have improved characteristics. Compared to a planar motor using a magnet assembly based on permanent magnets, the planar motor according to the invention may e.g. be more efficient due to an increased magnetic field strength generated by the SC magnet assembly, and/or it may have an increased operating area.

The planar motor according to the present invention may advantageously be applied in a positioning device according to the invention. Such a positioning device can e.g. comprising an object table for holding an object, e.g. a substrate in a lithographic apparatus.

The positioning device according to the present invention may further comprising a power supply for supplying a current to the SC coils of the magnet assembly. It may further comprise a position measurement system configured to determine a position of the object table. Such a position measurement system can e.g. be a system such as the position measurement system PMS described above. The positioning device according to the present invention may further comprise a control system configured to control the electromagnetic force of the electromagnetic motor, based on a feedback signal from the position measurement system, the feedback signal representing the position of the object table. Such a control system may e.g. correspond to the position control system PCS shown in FIG. 3.

The present invention further provides a lithographic apparatus comprising a positioning device according to the invention, e.g. for the positioning of a substrate.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Other aspects of the invention are set-out as in the following numbered clauses.

1. A magnet assembly for a planar electromagnetic motor, the magnet assembly comprising:
    a first plurality of superconductive (SC) coils inside an outer circumference and arranged in a planar pattern such as a rectangular pattern,
    a second plurality of SC coils, arranged along an outer boundary of the planar pattern, a coil of the first plurality of SC coils having a first in-plane shape and a coil of the second plurality of SC coils having a second in-plane shape, different from the first in-plane shape, wherein the second plurality of SC coils is at least partly arranged inside the outer circumference.
2. The magnet assembly according to clause 1, whereby the second plurality of SC coils is configured to, in use, at least partially compensate a non-uniformity of a magnetic field, as generated, in use, by the first set of coils, the non-uniformity occurring at or near the outer boundary of the planar pattern.
3. The magnet assembly according to clause 1 or 2, whereby the first plurality of SC coils is configured to generate a two-dimensional spatially alternating magnetic field.
4. The magnet assembly according to any of the clauses 1 to 3, whereby an outer boundary of the first in-plane shape or an outer boundary of the second in-plane shape has a substantially polygonal shape.
5. The magnet assembly according to clause 4, whereby the outer boundary of the first in-plane shape has a substantially rectangular, octagonal or hexagonal shape.
6. The magnet assembly according to clause 4 or 5, whereby the outer boundary of the second in-plane shape has a substantially triangular shape.
7. The magnet assembly according to any of the preceding clauses, whereby an outer width (Wo) of a coil of the first plurality of coils varies along an axial direction (AD) substantially perpendicular to a plane of the planar pattern.
8. The magnet assembly according to clause 7, whereby a cross-section of a coil of the first plurality of coils, in a plane substantially perpendicular to the plane of the planar pattern, comprises a tapered shape.
9. The magnet assembly according to clause 7 or 8, whereby an inner width (Wi) of the coil is substantially constant along the axial direction (AD), and whereby an outer width (Wo) of the coil increases along the axial direction.
10. The magnet assembly according to any of the preceding clauses, whereby a coil of the first plurality of coils or a coil of the second plurality of coils comprises multiple SC coils.
11. A superconductive (SC) coil assembly for a magnet assembly of a planar electromagnetic motor, the SC coil assembly comprising multiple SC coils.
12. The SC coil assembly according to clause 11, whereby the multiple SC coils have coinciding longitudinal axis.
13. The SC coil assembly according to clause 11 or 12 comprising an inner SC coil and an outer SC coil.
14. The SC coil assembly according to clause 13, whereby a height of the inner SC coil is different from a height of the outer SC coil.
15. The SC coil assembly according to clause 14, whereby the height of the inner SC coil is larger than the height of the outer SC coil.
16. The SC coil assembly according to clause 14 or 15, whereby a top surface of the inner SC coil is substantially flush with a top surface of the outer SC coil.
17. The SC coil assembly according to any of the clauses 13 to 16, whereby an in-plane shape of the inner SC coil is different from an in-plane shape of the outer SC coil.
18. The SC coil assembly according to clause 17, whereby the in-plane shape of the outer SC coil comprises a substantially polygonal boundary.
19. The SC coil assembly according to clause 18, whereby the in-plane shape of the outer SC coil comprises a substantially polygonal inner boundary, such as a triangular, rectangular, hexagonal or octagonal boundary.
20. The SC coil assembly according to clause 18 or 19, whereby the in-plane shape of the inner SC coil comprises a substantially circular boundary.
21. The SC coil assembly according to any of the clauses 13 to 20, whereby a winding characteristic of the inner SC coil is different from a winding characteristic of the outer SC coil.
22. The SC coil assembly according to clause 21, whereby the inner SC coil comprises multiple windings connected in parallel.
23. The SC coil assembly according to any of the clauses 13 to 22, wherein the inner SC coil and the outer SC coil are connected in series.
24. The SC coil assembly according to any of the clauses 13 to 22, wherein the inner SC coil and the outer SC coil are configured to be powered by different power supplies.
25. The SC coil assembly according to any of the clauses 11 to 24, wherein the SC coil assembly comprises a top SC coil and a bottom SC coil.
26. The SC coil assembly according to clause 25, whereby the top SC coil and the bottom SC coil have a common longitudinal direction.
27. The SC coil assembly according to clause 25 or 26, whereby a height of the top SC coil is different from a bottom SC coil.
28. The SC coil assembly according to any of the clause 25 to 27, further comprising an intermediate SC coil arranged in between the top SC coil and the bottom SC coil, along an axial direction (AD) of the top SC coil and the bottom SC coil.
29. The SC coil assembly according to clause 28, whereby the intermediate SC coil comprises an inner SC coil and an outer SC coil.
30. The SC coil assembly according to any of the clauses 25 to 29, whereby a superconductor applied in the top SC coil has a different grain orientation than a superconductor applied in the bottom SC coil or the intermediate SC coil.
31. The SC coil assembly according to any of the preceding clause 11 to 30, whereby one or more of the multiple coils comprises a non-insulated or metal-insulated superconductor.
32. A magnet assembly for a planar electromagnetic motor, the magnet assembly comprising a plurality of SC coil assemblies according to any of the clauses 11 to 31 for in use generating a two-dimensional spatially alternating magnetic field.
33. The magnet assembly according to any of the clauses 1 to 10 or clause 32, whereby top surfaces of the SC coils are substantially flush.
34. The magnet assembly according to clause 33, whereby the top surfaces define a plane of the magnet assembly which, during use, faces a coil assembly of the planar electromagnetic motor.
35. The magnet assembly according to any of the clauses 33 to 34, further comprising an electrically conductive layer, foil or plate, arranged on the top surfaces.
36. Planar electromagnetic motor comprising a magnet assembly according to any of the clauses 1 to 10 or 32 to 35, and a coil assembly configured to co-operate with the magnet assembly thereby generating, during use, an electromagnetic force to displace the coil assembly relative to the magnet assembly.
37. Positioning device comprising an object table and planar electromagnetic motor according to clause 36 for displacing the object table.
38. The positioning device according to clause 37, further comprising a power supply for supplying a current to the SC coils of the magnet assembly.
39. The positioning device according to clause 38, further comprising a position measurement system configured to determine a position of the object table.
40. The positioning device according to clause 39, further comprising a control system configured to control the electromagnetic force of the electromagnetic motor, based on a feedback signal from the position measurement system, the feedback signal representing the position of the object table.
41. A Lithographic apparatus comprising a positioning device according to clause 40 for positioning a substrate.

The invention claimed is:
1. A magnet assembly comprising:
a first plurality of superconductive (SC) coils inside an outer circumference and configured in a planar pattern, wherein the outer circumference defines a smallest rectangle that encloses the first plurality of SC coils; and
a second plurality of SC coils configured along an outer boundary of the planar pattern and at least partly configured inside the outer circumference;
wherein a coil of the first plurality of SC coils has a first in-plane shape and a coil of the second plurality of SC coils has a second in-plane shape, different from the first in-plane shape.
2. The magnet assembly of claim 1, wherein the second plurality of SC coils is configured to, in use, at least partially compensate for a non-uniformity of a magnetic field, as generated, in use, by the first plurality of SC coils, the non-uniformity occurring at or near the outer boundary of the planar pattern.
3. The magnet assembly of claim 1, wherein the first plurality of SC coils is configured to generate a two-dimensional spatially alternating magnetic field.
4. The magnet assembly of claim 1, wherein an outer boundary of the first in-plane shape or an outer boundary of the second in-plane shape has a substantially polygonal shape.
5. The magnet assembly of claim 4, wherein the outer boundary of the first in-plane shape has a substantially rectangular, octagonal or hexagonal shape.
6. The magnet assembly of claim 4, wherein the outer boundary of the second in-plane shape has a substantially triangular shape.
7. The magnet assembly of claim 1, wherein an outer width (Wo) of the coil or another coil of the first plurality of SC coils varies along an axial direction (AD) substantially perpendicular to a plane of the planar pattern.
8. The magnet assembly of claim 7, wherein a cross-section of the coil or the another coil of the first plurality of SC coils, in a plane substantially perpendicular to the plane of the planar pattern, comprises a tapered shape.
9. The magnet assembly of claim 7, wherein:
an inner width (Wi) of the coil or the another coil in the first plurality of SC coils is substantially constant along the axial direction (AD), and
an outer width (Wo) of the coil or the another coil in the first plurality of SC coils increases along the axial direction.
10. The magnet assembly of claim 1, wherein one or more coils of the first plurality of SC coils or one or more coils of the second plurality of SC coils comprises multiple SC coils.
11. The magnet assembly of claim 1, wherein top surfaces of the coils in the plurality of SC coils are substantially flush.
12. The magnet assembly of claim 11, wherein the top surfaces define a plane of the magnet assembly that, during use, faces a coil assembly of a planar electromagnetic motor.
13. The magnet assembly of claim 11, further comprising an electrically conductive layer, foil or plate, configured on the top surfaces.
14. A planar electromagnetic motor comprising:
a magnet assembly comprising:
a first plurality of superconductive (SC) coils inside an outer circumference and configured in a planar pattern, wherein the outer circumference defines a smallest rectangle that encloses the first plurality of SC coils;
a second plurality of SC coils configured along an outer boundary of the planar pattern and at least partly configured inside the outer circumference; and
a coil assembly configured to co-operate with the magnet assembly thereby generating, during use, an electromagnetic force to displace the coil assembly relative to the magnet assembly;
wherein a coil of the first plurality of SC coils has a first in-plane shape and a coil of the second plurality of SC coils has a second in-plane shape, different from the first in-plane shape.

15. A positioning device comprising:
an object table; and
the planar electromagnetic motor of claim 14, for displacing the object table.

16. The positioning device of claim 15, further comprising a power supply for supplying a current to the first plurality of SC coils and/or the second plurality of SC coils of the magnet assembly.

17. The positioning device of claim 16, further comprising a position measurement system configured to determine a position of the object table.

18. The positioning device of claim 17, further comprising a control system configured to control the electromagnetic force of the electromagnetic motor, based on a feedback signal from the position measurement system, the feedback signal representing the position of the object table.

19. A lithographic apparatus comprising:
the positioning device of claim 18 for positioning a substrate.

* * * * *